(12) United States Patent
Teboulle et al.

(10) Patent No.: US 11,067,613 B2
(45) Date of Patent: Jul. 20, 2021

(54) CONFIGURABLE ELECTRICITY METER

(71) Applicant: SAGEMCOM ENERGY & TELECOM SAS, Rueil-Malmaison (FR)

(72) Inventors: Henri Teboulle, Rueil-Malmaison (FR); Stéphane Hergault, Rueil-Malmaison (FR)

(73) Assignee: SAGEMCOM ENERGY & TELECOM SAS, Rueil Malmaison (FR)

( * ) Notice: Subject to any disclaimer, the term of this patent is extended or adjusted under 35 U.S.C. 154(b) by 307 days.

(21) Appl. No.: 16/319,112

(22) PCT Filed: Jul. 10, 2017

(86) PCT No.: PCT/EP2017/067309
§ 371 (c)(1),
(2) Date: Jan. 18, 2019

(87) PCT Pub. No.: WO2018/015202
PCT Pub. Date: Jan. 25, 2018

(65) Prior Publication Data
US 2019/0178921 A1 Jun. 13, 2019

(30) Foreign Application Priority Data
Jul. 21, 2016 (FR) ...................................... 1656978

(51) Int. Cl.
*G01R 22/06* (2006.01)
*G01R 21/133* (2006.01)
*G06Q 50/06* (2012.01)

(52) U.S. Cl.
CPC ......... *G01R 22/065* (2013.01); *G01R 21/133* (2013.01); *G01R 22/061* (2013.01); *G06Q 50/06* (2013.01)

(58) Field of Classification Search
CPC .................................................... G01R 22/065
(Continued)

(56) References Cited

U.S. PATENT DOCUMENTS 5,001,420 A   3/1991 Germer et al.
5,059,896 A   10/1991 Germer et al.
(Continued)

*Primary Examiner* — Ricky Go
(74) *Attorney, Agent, or Firm* — Muncy, Geissler, Olds & Lowe, P.C.

(57) ABSTRACT

Configurable meter that can be configured according to a first configuration in which the meter is capable of being connected directly to a phase conductor (40), and according to a second configuration in which the meter is capable of being connected to the phase conductor (40) via a transformer (41), the meter including an upstream current port (2a, 2c, 2e) and a downstream current port (2b, 2d, 2f), a voltage port (3), a circuit breaker (7) that is closed by default, and an access opening through which a conductive element of an adaption module extends when the latter is mounted on the meter, such that, when the adaption module is mounted on the meter, the conductive element opens the circuit breaker while being connected to the voltage port, the meter then being in the second configuration, and when the adaption module (24) is not mounted on the meter, the meter is in the first configuration. Adaption module. System comprising a meter and an adaption module. Method for configuring a meter.

9 Claims, 6 Drawing Sheets

(58) Field of Classification Search
USPC .......................................................... 702/61
See application file for complete search history.

(56) References Cited

U.S. PATENT DOCUMENTS

| | | | |
|---|---|---|---|
| 6,611,772 B1 | 8/2003 | Lavoie et al. | |
| 6,825,776 B2 * | 11/2004 | Lightbody | G01R 22/065 324/76.11 |
| 2007/0007944 A1 | 1/2007 | Burns et al. | |
| 2009/0295371 A1 * | 12/2009 | Pontin | G01R 1/04 324/142 |
| 2010/0282579 A1 * | 11/2010 | Brown | H01H 1/54 200/271 |
| 2014/0218010 A1 * | 8/2014 | Fulton | H01R 33/90 324/110 |
| 2015/0247900 A1 * | 9/2015 | Shuey | G01R 22/065 324/415 |

* cited by examiner

US 11,067,613 B2

CONFIGURABLE ELECTRICITY METER

The invention relates to the field of electricity meters.

BACKGROUND OF THE INVENTION

It is conventional to distinguish two types of electricity meter for measuring the consumption of electrical energy as supplied by a distribution network to an electrical installation.

First meters are for connecting directly to one or more phase conductors of a distribution network, which conductors typically convey currents of a few tens of amps at voltages of a few hundreds of volts.

Second meters are for connecting to one or more phase conductors of a distribution network that typically convey currents of several hundreds of amps, the connection being via one or more transformers situated on the phase conductors. Those transformers typically present a transformation ratio lying in the range 100 to 1000.

Connecting to the distribution network via transformers makes it necessary to design second meters that are different from first meters. In particular, second meters have mechanical interfaces and ports for connection to phase conductors that are different from those of first meters. It is therefore necessary to design, to qualify, and to fabricate two different types of meter, thereby increasing the cost of both types of meter.

OBJECT OF THE INVENTION

An object of the invention is to reduce the costs of an electricity meter.

SUMMARY OF THE INVENTION

In order to achieve this object, there is provided an electricity meter configurable to occupy a first configuration in which the meter is adapted to be connected to a phase conductor of a distribution network directly, and to occupy a second configuration in which the meter is adapted to be connected to the phase conductor via a transformer situated on the phase conductor, the meter having an upstream current port and a downstream current port for connecting to the phase conductor, a voltage port, a disconnector that is closed by default having a movable contact with a stationary end connected the voltage port and a movable end connected to the upstream current port when the disconnector is closed, a docking device adapted to dock an adapter module, and an access orifice through which a conductive element of the adapter module extends when the adapter module is mounted on the meter, such that when the adapter module is mounted on the meter, the conductive element is in contact with the movable contact of the disconnector and opens the disconnector while being connected to the voltage port, the meter then occupying the second configuration, and when the adapter module is not mounted on the meter, the meter occupies the first configuration.

The meter of the invention is thus adapted to operate either by being connected directly to the phase conductor of the distribution network, or else by being connected to the phase conductor via a transformer situated on that phase conductor. These two modes of connection to the distribution network thus require only one type of meter, thereby significantly reducing development, testing, and fabrication costs for the meter. Configuration of the meter is simple and inexpensive to perform, since it consists merely in mounting the adapter module on the meter.

The invention also provides an adapter module adapted to configure a meter as described above.

The invention also provides a system comprising a meter and an adapter module.

The invention also provides a method of configuring such a meter.

The invention can be better understood in the light of the following description of a particular, non-limiting embodiment of the invention.

BRIEF DESCRIPTION OF THE DRAWINGS

Reference is made to the accompanying drawings, in which.

DETAILED DESCRIPTION OF THE INVENTION

Figure 1:
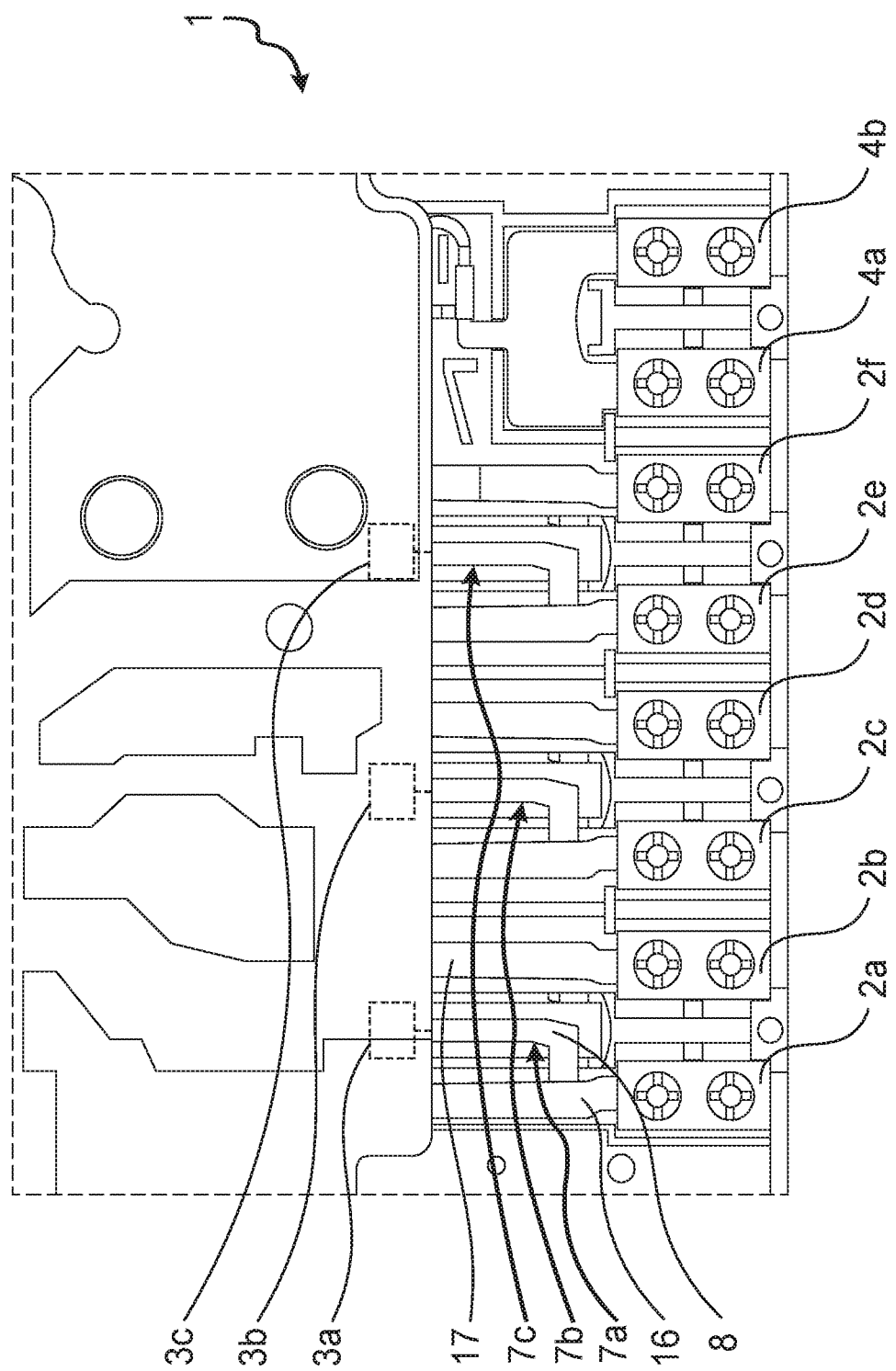
FIG. 1 is a view of the inside of a meter of the invention.
Figure 3:
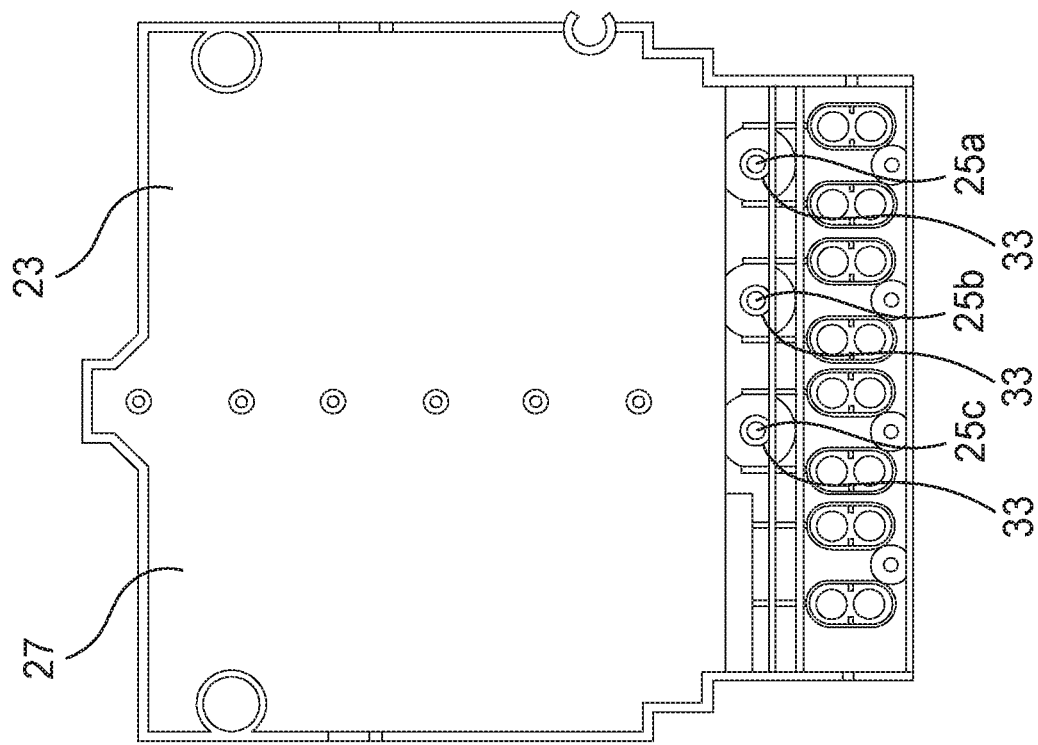
FIG. 3 is a view from beneath of a fixed base of the meter of the invention.
Figure 2:
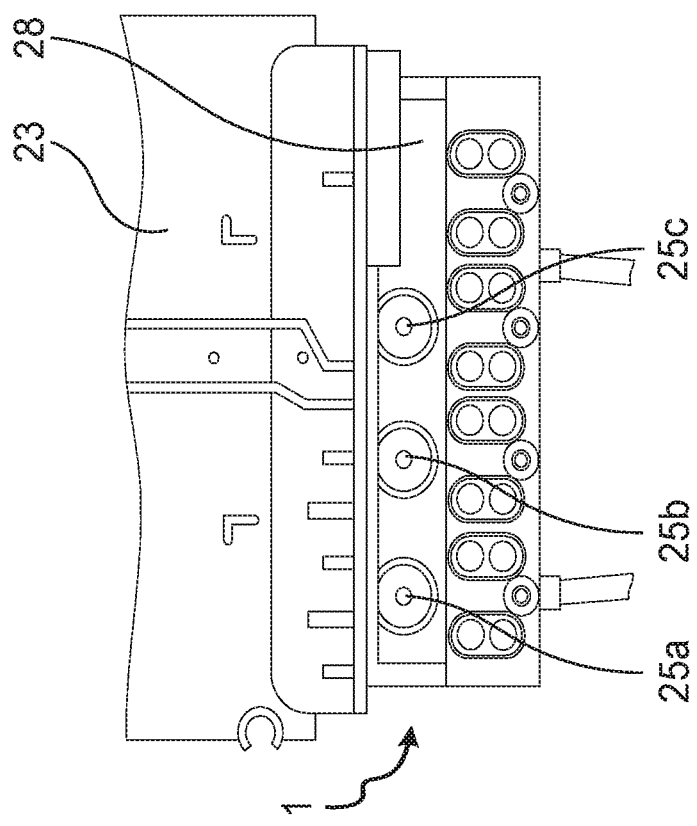
FIG. 2 is a plan view of the meter of the invention, the adapter module not being mounted on the meter.
Figure 4:
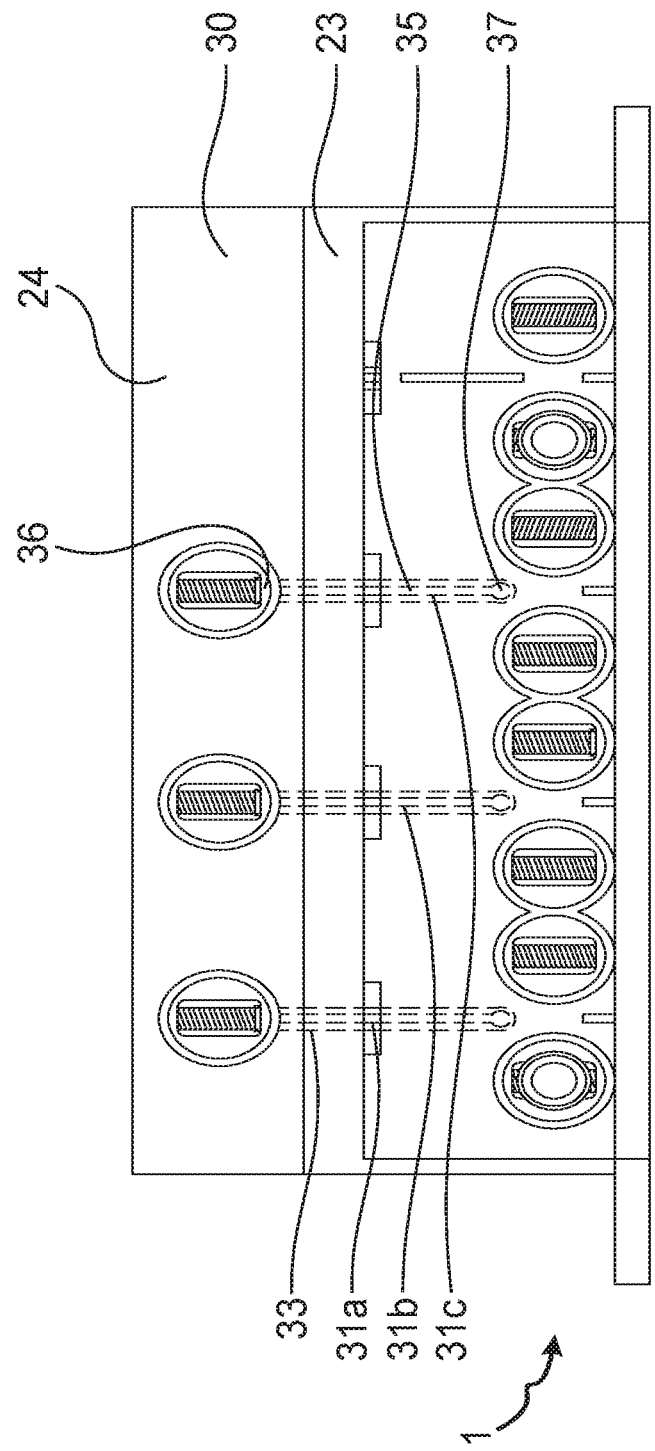
FIG. 4 shows the adapter module mounted on the meter of the invention, the adapter module shown in front view.
Figure 5:
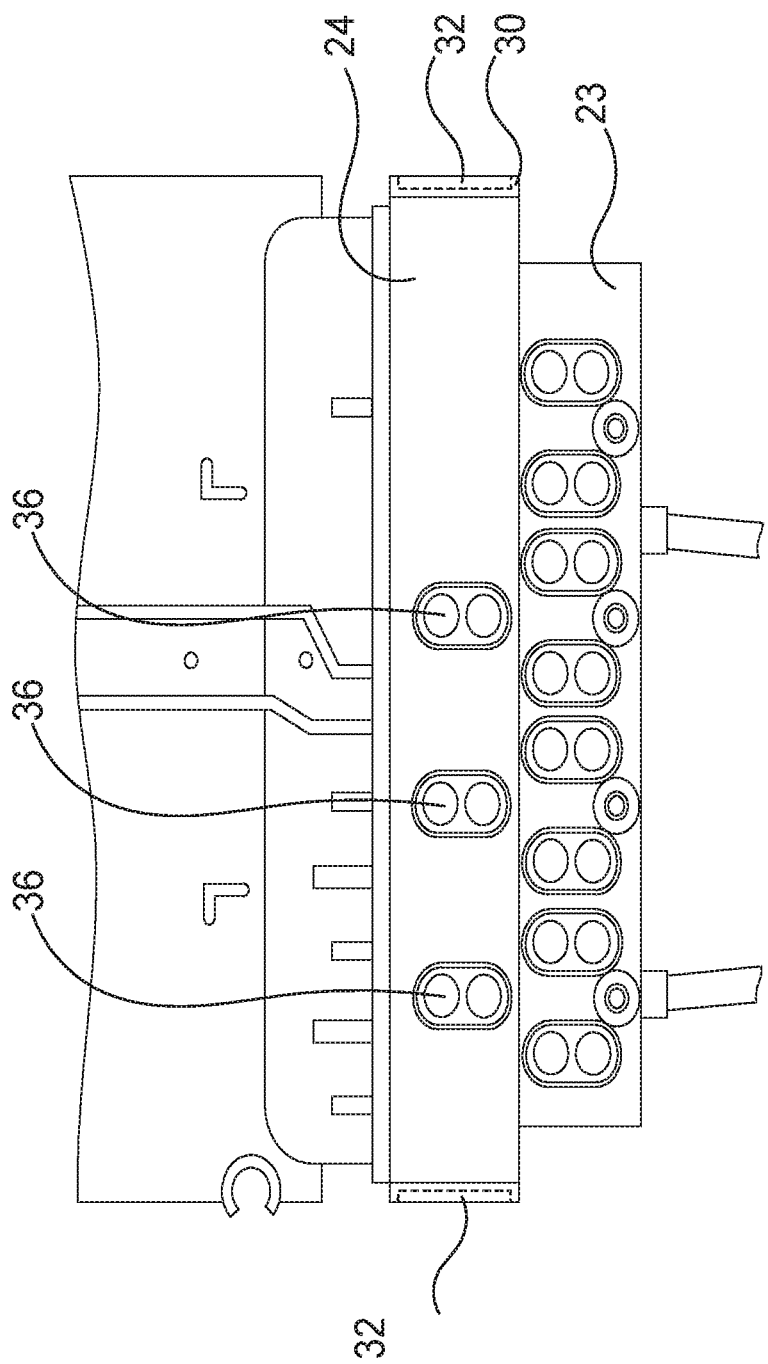
FIG. 5 is a view analogous to FIG. 4, the adapter module being shown in plan view.

With reference to the figures, the invention relates to an energy meter 1, specifically a three-phase electricity meter.

The meter 1 has a first upstream current port 2*a*, a first downstream current port 2*b*, a first voltage port 3*a*, a second upstream current port 2*c*, a second downstream current port 2*d*, a second voltage port 3*b*, a third upstream current port 2*e*, a third downstream current port 2*f*, a third voltage port 3*c*, a first neutral port 4*a*, and a second neutral port 4*b*.

Although the current port 2 and the neutral ports 4 are directly accessible from outside the meter 1 for connection to a distribution network 6, the voltage ports 3 are ports internal to the meter 1 and are not accessible from outside the meter 1.

The meter 1 also has a first disconnector 7*a*, a second disconnector 7*b*, and a third disconnector 7*c*. The first disconnector 7*a* is connected between the first upstream current port 2*a* and the first voltage port 3*a*. The second disconnector 7*b* is connected between the second upstream current port 2*c* and the second voltage port 3*b*. The third disconnector 7*c* is connected between the third upstream current port 2*e* and the third voltage port 3*c*.

Each disconnector 7 is normally closed. Each disconnector 7 has a movable contact 8 made of copper with a stationary end connected to the associated voltage port 3 and a movable end connected to the associated upstream current port 2*a*, 2*c*, 2*e* when the disconnector 7 is closed.

The meter 1 also has processor means and measurement means. The processor means comprise a processor module, specifically a microcontroller 9. The measurement means comprise an analog-to-digital converter 10 connected to the microcontroller 9, a first current sensor 12*a* connected to the first upstream current port 2*a* and to the first downstream current port 2b, a first voltage sensor 13a connected to the first voltage port 3a (and thus to the movable contact 8 of the first disconnector 7a), a second current sensor 12b connected to the second upstream current port 2c and to the second downstream current port 2d, a second voltage sensor 13b connected to the second voltage port 3b (and thus to the movable contact 8 of the second disconnector 7b), a third current sensor 12c connected to the third upstream current port 2e and to the third downstream current port 2f, and a third voltage sensor 13c connected to the third voltage port 3c (and thus to the movable contact 8 of the third disconnector 7c).

Each current sensor 12 is connected to an upstream current port 2a, 2c, 2e via a first copper arm 16 and to a downstream current port 2b, 2d, 2f via a second copper arm 17. Each current sensor 12 includes an internal transformer 18 in the form of a torus connected respectively between the upstream current port 2a, 2c, 2e and the downstream current port 2b, 2d, 2f, and a resistor 19 connected in parallel with the internal transformer 18. The internal transformer 18 provides electrical isolation. In this example, the internal transformer 18 has a transformation ratio equal to 2500. The resistor 19 has one terminal connected to an input of the analog-to-digital converter 10 and another terminal connected to the first neutral port 4a of the meter 1 (and to a ground of the meter 1). The resistor 19 transforms the current flowing in the internal transformer 18 into a voltage. The analog-to-digital converter 10 measures voltages that are the images of the currents flowing between respective upstream current ports 2a, 2c, 2e and downstream current ports 1b, 2d, 2f.

Each voltage sensor 13 has a first resistor 20 and a second resistor 21. The first resistor 20 has one terminal connected to the associated voltage port 3 and another terminal connected to one terminal of the second resistor 21. The other terminal of the second resistor 21 is connected to the first neutral port 4a. The terminals of the first and second resistors 20 and 21 that are connected to each other are also connected to respective inputs of the analog-to-digital converter 10. The first resistor 20 and the second resistor 21 act as a voltage divider, reducing the voltage at the voltage port 3 to a level that is acceptable for the analog-to-digital converter 10. The analog-to-digital converter 10 measures a voltage that is the image of the voltage of the voltage port 3.

The microcontroller 9 acquires the current measurements and the digital voltage measurements produced by the analog-to-digital converter 10, and it processes those current measurements and digital voltage measurements in order to obtain measurements that correspond to the currents and the voltages actually present on the distribution network 6.

The meter 1 also has a fixed base 23 made of plastics material, a docking device adapted to dock an adapter module 24, and a detector adapted to detect whether the adapter module 24 is or is not connected to the meter 1.

The meter 1 has a removable cover (not shown) that serves to protect access to the connectors. When the removable cover is mounted on the meter 1, it is positioned on a front face of the meter 1 (i.e. a face that is opposite from a face of the meter 1 that is for fixing to a wall). The removable cover gives access to the inside of the meter 1, in particular during fabrication and during stages of testing the meter 1. It is naturally possible to close the removable cover in irreversible manner (the removable cover may be sealed to the meter 1 when the meter is installed).

The fixed base 23 has a first access orifice 25a, a second access orifice 25b, and a third access orifice 25c. The access orifices 25 connect the outside of the meter 1 to the inside of the meter 1.

Each access orifice 25 has a plastics material guide 33 that extends perpendicularly to an inside face 27 of the fixed base 23. The access orifices 25 are positioned in such a manner that the first access orifice 25a opens out into the meter 1 facing the movable contact 8 of the first disconnector 7a, the second access orifice 25 opens out into the meter 1 facing the movable contact 8 of the second disconnector 7b, and the third access orifice 25c opens out into the meter 1 facing the movable contact 8 of the third disconnector 7c.

The docking device for the adapter module comprises a cavity 28 formed in the fixed base 23, the access orifices 25 themselves, and snap-fastener means formed on the fixed base 23.

The adapter module 24 comprises a housing 30, a first conductive element 31a, a second conductive element 31b, and a third conductive element 31c. Each conductive element 31, which is of longitudinal shape, is surrounded by a respective cylindrical guide 33 made of plastics material.

The housing 30 is of generally rectangular outside shape. The back wall of the housing 30 presents a shape complementary to the cavity 28 of the docking device, such that the housing 30 of the adapter module can be engaged in the fixed base 23. The housing 30 also has a fastener device, specifically comprising the snap-fastener means 32, formed on the side faces of the housing 30. When the adapter module 24 is mounted on the meter 1 and the housing 30 is engaged in the fixed base 23, the snap-fastener means 32 of the housing 30 co-operate with the snap-fastener means of the fixed base 23 so as to fasten the housing and thus the adapter module 24 to the fixed base 23 of the meter 1.

Each conductive element 31 comprises a conductive rod 35 that includes a connection member 36 at a first end and that presents a second end 37 that is enlarged.

The conductive elements 31 (and the cylindrical guide 33) extend from the housing 30 so as to project from the housing 30 in such a manner that when the housing 30 is engaged in the fixed base 23, each conductive element 31 (together with its cylindrical guide 33) extends in an access orifice 25. When the conductive elements 31 are inserted into the access orifices 25, the enlarged second end 37 of the conductive rod 35 of each conductive element 31 comes into contact with the movable contact 8 of a disconnector 7, and opens the disconnector 7 while remaining in contact with the movable contact 8. The conductive rod 35 and thus the connection member 36 are thereby connected to the associated voltage port 3. When the conductive element 31 is fully inserted, the enlarged second end 37 forms a snap-fastener member that co-operates with a complementary snap-fastener member of the meter 1 in order to snap-fasten the conductive element 31 in the meter 1.

The detector of the meter 1, adapted to detect whether the adapter module 24 is or is not mounted on the meter 1, comprises a pushbutton that is connected to the microcontroller 9. When the adapter module 24 is mounted on the meter 1, a plastics material peg formed on the adapter module 24 presses on the pushbutton. The microcontroller 9 thus detects that the adapter module 24 is mounted on the meter 1.

The meter 1 is a meter that is configurable to occupy a first configuration in which the meter 1 is adapted to be connected to the phase conductors 40 of the distribution network 6 directly, and to occupy a second configuration in which the meter 1 is adapted to be connected to the phase conductors 40 of the distribution network 6 via transformers 41 situated on the phase conductors 40.

In the first configuration, the adapter module 24 is not mounted on the meter 1. In the second configuration, the adapter module 24 is mounted on the meter 1.

Configuring the meter 1 thus consists firstly in determining whether the meter 1 is for connecting to the phase conductors 40 of the distribution network 6 directly, or whether the meter 1 is for connecting to the phase conductors 40 via transformers 41 situated on the phase conductors 40. Thereafter, if the meter 1 is to be connected to the phase conductors 40 via the transformers 11, configuring the meter 1 consists in mounting the adapter module 24 on the meter 1.

The meter 1 may be configured in the factory, after the meter 1 has been fabricated and prior to delivering the meter 1 to the electricity distributor. The meter 1 can also be configured by the electricity distributor, who then needs to manage only one stock of meters 1 that are similar. The electricity distributor then configures meters prior to installing them, as a function of the configuration that is required.

There follows a description in greater detail of the manner in which the meter 1 is connected to the distribution network 6, depending on whether the meter 1 is connected directly to the distribution network 6 or else via the transformers 41.

When the meter 1 adapted to be connected directly to the distribution network 6 that supplies electricity to a client's electrical installation 42, the adapter module 24 is not mounted on the meter 1, and the meter 1 is an its first configuration.

Figure 6:
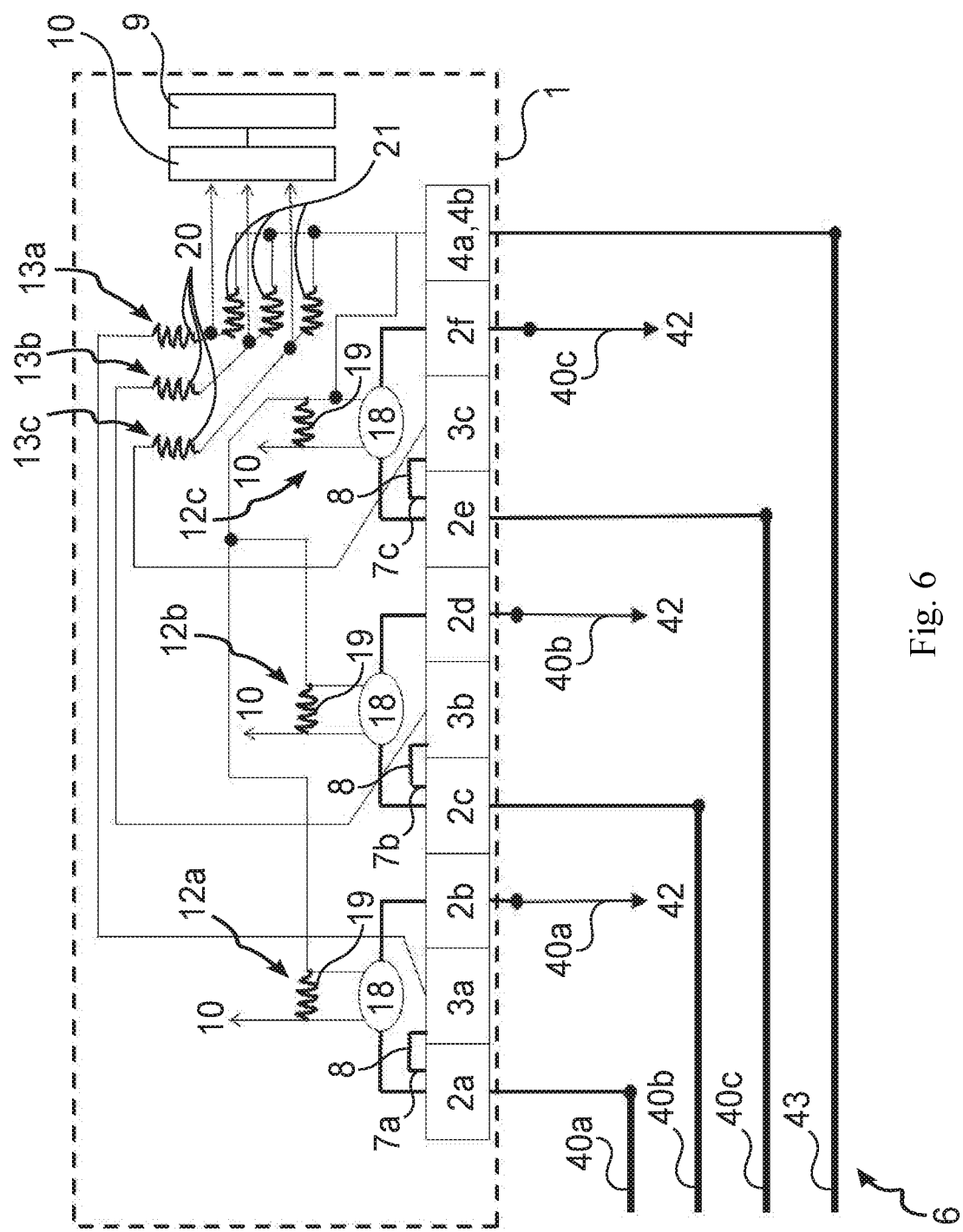
FIG. 6 is an equivalent circuit diagram for the meter of the invention when connected to the phase conductors of a distribution network directly.

This situation is visible in FIG. 6. The phase conductors 40 of the distribution network 6 do not include respective transformers.

The first upstream current port 2*a* of the meter 1 is connected to a first phase conductor 40*a* of the distribution network 6 upstream from the meter 1, while the first downstream current port 2*b* is connected to the first phase conductor 40*a* downstream from the meter 1. The first disconnector 7*a* is closed. The first current sensor 12*a* measures the current flowing between the first upstream port 2*a* and the first downstream port 2*b*, and thus the current flowing in the first phase conductor 40*a*. The first voltage sensor 13*a*, connected to the first voltage port 3*a*, and thus to the first upstream current port 2*a* via the movable contact 8 of the first disconnector 7*a* (which is closed). The first voltage sensor 13*a* thus measures the voltage on the first phase conductor 40*a* upstream from the meter 1.

This applies likewise to the second phase conductor 40*b* (with the second current sensor 12*b* and the second voltage sensor 13*b*) and to the third phase conductor 40*c* (with the third current sensor 12*c* and the third voltage sensor 13*c*).

The first neutral port 4*a* of the meter 1 (which neutral port 4*a* is at the same potential as the second neutral port 4*b*, since the internal copper bar is the same bar for the first neutral port 4*a* and for the second neutral port 4*b*) is connected to the neutral conductor 13 of the distribution network 6. The second neutral port 4*b* is connected to a ground of the client's electrical installation 42.

Since the adapter module 24 is not mounted on the meter 1, the detector does not detect the presence of the adapter module 24. The microcontroller 9 thus performs first processing using first parameters on the current and voltage measurements. In particular, the first processing takes account of the fact that the meter 1 is connected directly to the distribution network 6 directly, and not via transformers, so as to obtain measurements corresponding to the currents and to the voltages that are actually present on the distribution network 6.

Figure 7:
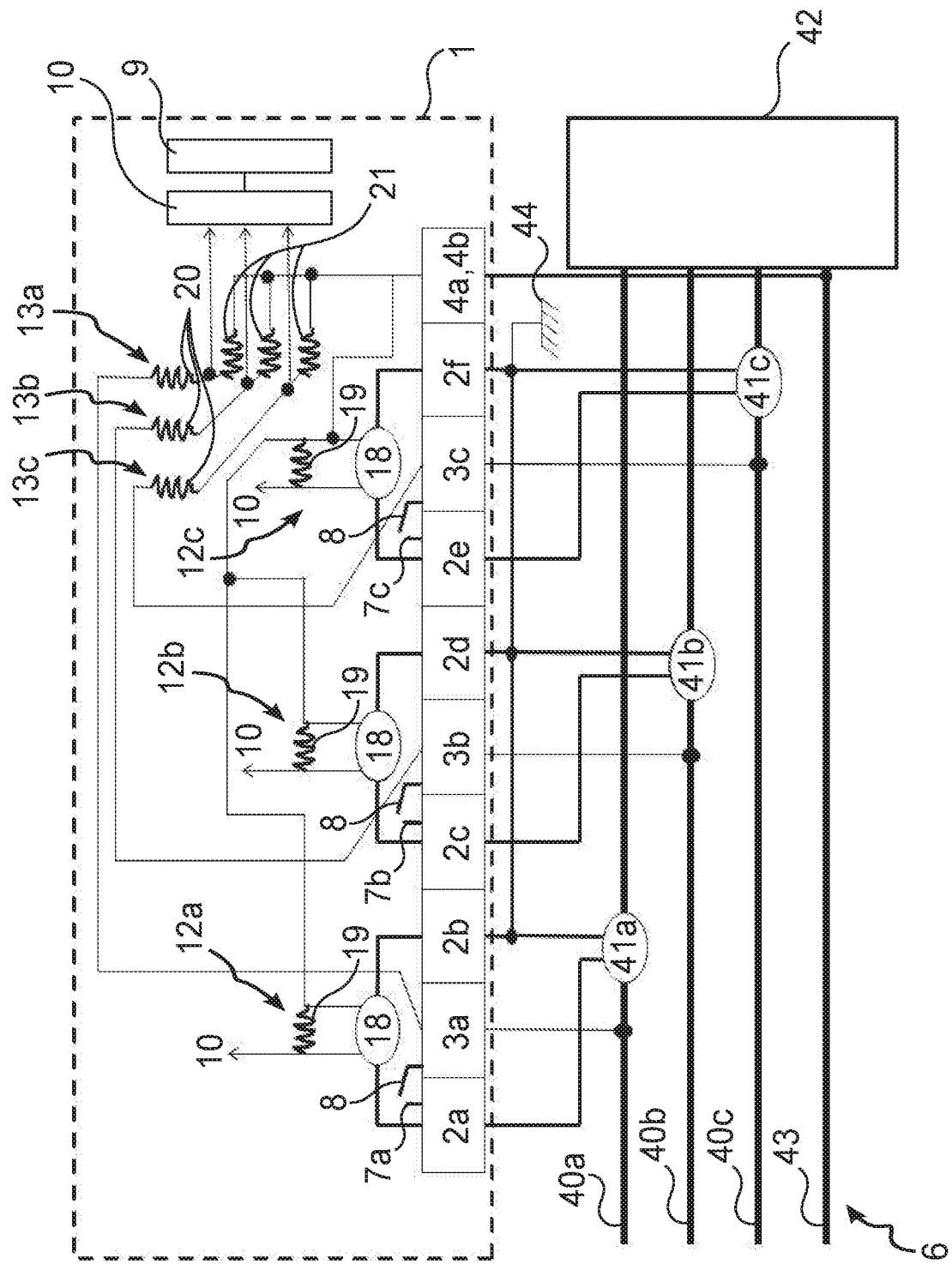
FIG. 7 is an equivalent circuit diagram for the meter of the invention when connected to the phase conductors of a distribution network via transformers.

When the meter 1 is connected to the distribution network 6 via the transformers 41, the adapter module 24 is mounted on the meter 1 and the meter 1 is in the second configuration. This situation is visible in FIG. 7. The meter 1 shown in FIG. 7 is the same in terms of hardware as the meter 1 shown in FIG. 6 (except that it is only in FIG. 7 that the adapter module 24 is mounted on the meter 1).

The first phase conductor 40*a* includes a first transformer 41*a*. The second phase conductor 40*b* includes a second transformer 41*b*. The third phase conductor 10*c* includes a third transformer 41*c*.

Each transformer 41 is in the form of a torus and serves to convert the very high currents (several hundreds of amps) that flow in the phase conductors 40 to lower currents that are compatible with the current sensors 12 of the meter 1.

The first transformer 41*a* has the first phase conductor 40*a* passing therethrough without being connected to it. The first transformer 41*a* has a secondary with a first terminal connected to the first upstream current port 2*a* and having a second terminal connected to the first downstream current port 2*b*.

The first phase conductor 40*a* associated with the first transformer 41*a* is also connected to the first voltage port 3*a* via the first conductive element 31*a* of the adapter module 24 connected to the meter 1. The first phase conductor 40*a* is connected to the connection member 36 of the first conductive element 31*a*.

The first disconnector 7*a* is open.

The first current sensor 12*a* measures the current flowing between the first upstream port 2*a* and the first downstream port 2*b*, and thus the current flowing in the secondary of the first transformer 41*a* (which is an image of the current actually flowing in the first phase conductor 40*a*).

The first voltage sensor 13*a*, connected to the first voltage port 3*a*, and thus to the first phase conductor 40*a* upstream from the meter 1, via the first conductive element 31*a* of the adapter module 24 and via the movable contact 8 of the first disconnector 7*a*, serves to measure the voltage on the first phase conductor 40*a* upstream from the meter 1.

This applies likewise to the second phase conductor 40*b* (with the second transformer 41*b*, the second current sensor 12*b*, and the second voltage sensor 13*b*) and to the third phase conductor 40*c* (with the third transformer 41*c*, the third current sensor 12*c*, and the third voltage sensor 13*c*).

The second terminals of the secondaries of the transformers 41 are connected to one another and they are connected to a ground 44 of the client's electrical installation 42.

The first neutral port 4*a* (at the same potential as the second neutral port 4*b*) of the meter 1 is connected to the neutral conductor 43 of the distribution network 6. The second neutral port 4*b* is connected to a ground of the client's electrical installation 42.

It should be observed that the current measurements taken by the first current sensor 12*a* are completely decorrelated from the voltage measurements taken by the first voltage sensor 13*a*. This applies likewise to the measurements taken by the second current sensor 12*b* and the second voltage sensor 13*b*, and by the third current sensor 12*c* and the third voltage sensor 13*c*.

Since the adapter module 24 is mounted on the meter 1, the detector detects the presence of the adapter module 24. The microcontroller 9 thus performs second processing using second parameters on the current and voltage measurements. In particular, the second processing takes account of the fact that the meter 1 is connected to the distribution network 6 via the transformers 41 so as to produce measurements that correspond to the currents and the voltages that are actually present on the distribution network 6.

Thus, the first processing and the second processing differ in particular by taking account of the transformation ratio of the transformers 41.

It should be observed that when the meter 1 is configured in the factory, it may be advantageous to mount the adapter module 24 on the meter 1 prior to riveting the meter 1 and calibrating it in the factory. The meter 1 is thus in its second configuration being provided with the adapter module 24 in order to define calibration parameters possibly used by the second processing.

Naturally, the invention is not limited to the embodiment described but covers any variant coming within the ambit of the invention as defined by the claims.

Although the meter shown herein is a three-phase meter, the invention naturally applies to a single-phase meter, or to any type of polyphase meter.

Although the meter in the first configuration and the meter in the second configuration as described above are meters that are identical in hardware terms (apart from the presence of the adapter module), it is possible to make provision for replacing the internal toruses on site in order to adapt them to the second configuration of the meter. Advantageously, provision is made to be able to replace the internal toruses without unriveting the meter. By way of example, the copper arms of the disconnectors and the associated internal toruses may then be removable and accessible merely by opening the removable cover (which itself may optionally be sealed to the meter).

The above description refers to using disconnectors. The term "disconnector" is used to cover any type of circuit-breaker, switch, etc. member suitable for opening and closing an electric circuit by moving a movable contact.

Above, the meter has provision for automatically detecting the presence of the adapter module, thereby enabling the microcontroller to adapt the processing it performs automatically as a function of the configuration of the meter. It would also be possible to fit the meter with an interface making it possible from outside the meter to communicate with the microcontroller to inform it whether the meter is in the first configuration or in the second configuration. By way of example, the interface may be a manual interface, accessible to an operator, or else a computer interface, accessible via a server.

The invention claimed is:

1. An electricity meter configurable to occupy a first configuration in which the meter is adapted to be connected to a phase conductor of a distribution network directly, and to occupy a second configuration in which the meter is adapted to be connected to the phase conductor via a transformer situated on the phase conductor, the meter comprising:
    an upstream current port and a downstream current port for connecting to the phase conductor,
    a voltage port,
    a disconnector that is closed by default having a movable contact with a stationary end connected to the voltage port and a movable end connected to the upstream current port when the disconnector is closed,
    a docking device adapted to dock an adapter module, and
    an access orifice through which a conductive element of the adapter module extends when the adapter module is mounted on the meter, such that when the adapter module is mounted on the meter, the conductive element is in contact with the movable contact of the disconnector and opens the disconnector while being connected to the voltage port, the meter then occupying the second configuration, and when the adapter module is not mounted on the meter, the meter occupies the first configuration.

2. The meter according to claim 1, comprising a fixed base in which the access orifice is formed.

3. The meter according to claim 1, comprising a processor module connected to the current sensor and to the voltage sensor, the processor module being adapted to perform first processing on the current measurements and on the voltage measurements when the meter is in the first configuration, and second processing on the current measurements and the voltage measurements when the meter is in the second configuration.

4. The meter according to claim 3, wherein the first processing and the second processing differ by taking account of a transformation ratio of the transformer.

5. The meter according to claim 3, comprising an interface making it possible from outside the meter to inform the processor module whether the meter is in the first configuration or in the second configuration.

6. The meter according to claim 1, comprising a detector adapted to detect whether the meter is in the first configuration or is in the second configuration, and for transmitting the results of the detection to the processor module.

7. An adapter module adapted to configure the meter according to claim 1, the adapter module comprising:
    a fastener device adapted to fasten the adapter module on the meter, and
    a conductive element designed to extend through the access orifice of the meter, wherein the conductive element has a connection member at a first end adapted to be connected to the phase conductor of the distribution network, and has a second end that is enlarged and adapted to snap-fasten the conductive element in the meter.

8. A system comprising the meter according to claim 1, comprising:
    an adapter module-adapted to fasten the adapter module on the meter, and
    a conductive element designed to extend through the access orifice of the meter, wherein the conductive element has a connection member at a first end adapted to be connected to the phase conductor of the distribution network, and has a second end that is enlarged and adapted to snap-fasten the conductive element in the meter.

9. A method of configuring the meter according to claim 1, the method comprising the steps of:
    determining whether the meter is to be connected to a phase conductor of a distribution network directly, or whether the meter is to be connected to the phase conductor via a transformer situated on the phase conductor; and
    if the meter is to be connected via the transformer, mounting an adapter module adapted to fasten the adapter module on the meter and a conductive element designed to extend through the access orifice of the meter, the conductive element having a connection member at a first end adapted to be connected to the phase conductor of the distribution network, and having a second end that is enlarged and adapted to snap-fasten the conductive element on the meter.

\* \* \* \* \*